United States Patent
Kamiyama et al.

(10) Patent No.: US 8,525,594 B2
(45) Date of Patent: Sep. 3, 2013

(54) RADIO FREQUENCY AMPLIFIER CIRCUIT

(75) Inventors: Tomohide Kamiyama, Osaka (JP); Hiroshi Naitou, Osaka (JP); Takashi Uno, Hyogo (JP); Kazuhiro Yahata, Osaka (JP); Toshio Ishizaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 51 days.

(21) Appl. No.: 13/394,974

(22) PCT Filed: Jun. 9, 2011

(86) PCT No.: PCT/JP2011/003266
§ 371 (c)(1),
(2), (4) Date: Mar. 8, 2012

(87) PCT Pub. No.: WO2011/161890
PCT Pub. Date: Dec. 29, 2011

(65) Prior Publication Data
US 2012/0169423 A1   Jul. 5, 2012

(30) Foreign Application Priority Data
Jun. 21, 2010   (JP) .................................. 2010-141046

(51) Int. Cl.
*H03F 3/16*   (2006.01)

(52) U.S. Cl.
USPC .......................................... 330/277; 330/295

(58) Field of Classification Search
USPC ..................... 330/277, 295, 124 R, 84, 126
See application file for complete search history.

(56) References Cited

U.S. PATENT DOCUMENTS

| | | | |
|---|---|---|---|
| 5,420,541 A * | 5/1995 | Upton et al. | 330/286 |
| 6,201,445 B1 * | 3/2001 | Morimoto et al. | 330/295 |
| 6,396,348 B1 | 5/2002 | Honjo | |
| 6,614,311 B2 | 9/2003 | Takenaka | |
| 6,759,908 B2 | 7/2004 | Gotou et al. | |
| 7,511,575 B2 * | 3/2009 | Gotou et al. | 330/295 |
| 7,741,907 B2 | 6/2010 | Takagi | |
| 2002/0063603 A1 | 5/2002 | Gotou et al. | |
| 2002/0067212 A1 | 6/2002 | Takenaka | |
| 2004/0145034 A1 | 7/2004 | Fujioka et al. | |
| 2004/0169560 A1 | 9/2004 | Staudinger et al. | |
| 2008/0252382 A1 | 10/2008 | Takagi | |

FOREIGN PATENT DOCUMENTS

| | | |
|---|---|---|
| JP | 1-279612 | 11/1989 |
| JP | 5-226951 | 9/1993 |
| JP | 2738701 | 4/1998 |
| JP | 11-145744 | 5/1999 |
| JP | 2001-111362 | 4/2001 |
| JP | 2002-164753 | 6/2002 |
| JP | 2002-171138 | 6/2002 |
| JP | 2004-228989 | 8/2004 |
| JP | 2005-117200 | 4/2005 |
| JP | 2008-263438 | 10/2008 |
| JP | 4335633 | 9/2009 |

* cited by examiner

*Primary Examiner* — Henry Choe
(74) *Attorney, Agent, or Firm* — Wenderoth, Lind & Ponack, L.L.P.

(57) ABSTRACT

A radio frequency amplifier circuit according to the present invention is for providing a radio frequency amplifier circuit with high output and high efficiency, and includes (i) a first harmonic processing circuit (102) and (ii) a second harmonic processing circuit (103) which are connected to an output terminal of transistors (101), and a (iii) fundamental matching circuit (104) connected to a downstream of the first harmonic processing circuit (102) and the second harmonic processing circuit (103). The radio frequency amplifier circuit includes plural first harmonic processing circuits (102) and plural second harmonic processing circuits (103).

19 Claims, 5 Drawing Sheets

RADIO FREQUENCY AMPLIFIER CIRCUIT

TECHNICAL FIELD

The present invention relates to a radio frequency amplifier circuit using a harmonic processing circuit, and particularly to a radio frequency amplifier circuit using a class F circuit.

BACKGROUND ART

Improving power efficiency of the radio frequency amplifier circuit is directly linked to reducing power consumption of a device, and is a very important characteristic. In a high output amplifier circuit, in addition to high power consumption of a device, low efficiency converts inputted power into heat, which causes designing of heat release to be more difficult and decreases reliability of the device.

Conventionally, as a method for causing the radio frequency amplifier circuit to operate with high efficiency, a class F circuit and an inverse class F circuit have been generally used, and mechanisms of these high efficiency circuits have become publicly known. In short, in the amplifier circuit, the efficiency decreases because of an increase in power loss, and what is needed for avoiding the increase in power loss is to adjust a voltage/current waveform at an output, thereby forming an optimal waveform. Specifically, it is required to reduce an area in which the voltage waveform and the current waveform overlap. For example, when a transistor used for the amplifier circuit is biased to a class B operation, only a fundamental and an even harmonic are included in the output current waveform. Therefore, to eliminate the overlap, it is sufficient to set only the fundamental and an odd harmonic as the output voltage waveform. For this, by causing the even harmonic to be in a shorted state and the odd harmonic to be in an open state for an output of the transistor, theoretically, the efficiency reaches 100%. This is the class F circuit. Conversely, a case where the even harmonic is in the open state and the odd harmonic is in the shorted state is the inverse class F circuit, and these circuits are selectively used depending on an on-resistance, a bias condition, and the like of the transistor to be used.

A high-efficiency radio frequency amplifier circuit using the conventional class F circuit is disclosed in PTL 1.

FIG. 4A shows an analogous circuit showing a configuration of the conventional radio frequency amplifier circuit.

As shown in FIG. 4A, this radio frequency amplifier circuit includes a transistor 401, a first inductor 402A including a lumped parameter element, a capacitor 402B, fundamental matching inductors 404A and 404B, and a fundamental matching capacitor 404C. In the circuit, a secondary harmonic processing circuit 402 including the first inductor 402A and the capacitor 402B is connected to an output terminal of the transistor 401 in parallel, the fundamental matching inductors 404A and 404B are connected to the output terminal of the transistor 401 in series, and the fundamental matching capacitor 404C is connected between the fundamental matching inductors 404A and 404B in parallel. The above circuit structure performs a secondary harmonic processing and improves the efficiency. That is, by setting the first inductor 402A and the capacitor 402B such that the secondary harmonic processing circuit 402, as a series resonance circuit, resonates at a frequency twice as high as the fundamental, impedance for the secondary harmonic becomes 0 and the shorted state in the secondary harmonic for the output terminal of the transistor 401 is achieved. Furthermore, a fundamental matching circuit 404, including the fundamental matching inductors 404A and 404B and the fundamental matching capacitor 404C, is connected to the transistor 401.

FIG. 4B shows a layout of the radio frequency amplifier circuit in FIG. 4A.

As shown in FIG. 4B, the output terminal (drain terminal) 401A of the transistor 401 and the capacitor 402B are connected through a wire which is the first inductor 402A included in the secondary harmonic processing circuit 402. Meanwhile, the output terminal 401A of the transistor 401 and the fundamental matching capacitor 404C are connected through a wire which is the fundamental matching inductor 404A included in the fundamental matching circuit 404. Furthermore, to connect the output terminal 401A of the transistor 401 to an external circuit 406, a wire which is the inductor 404B is formed. Here, the capacitor 402B and the fundamental matching capacitor 404C are pattern-formed on a dielectric substrate 405.

Moreover, PTL 2 discloses a radio frequency amplifier circuit capable of processing an even higher-order harmonic, as shown in FIG. 5.

In this radio frequency amplifier circuit, when a wavelength of the fundamental is set to λ, a distributed parameter element having a line length of λ/4 is connected to an output of a transistor 501, and a distributed parameter element group 502 is connected to this distributed parameter element in parallel. Each of the distributed parameter element group 502 includes harmonic processing circuits 502A, each of which includes a distributed parameter element and distributed parameter elements 502B. The harmonic processing circuit 502A has a line length of λ/8 in the secondary harmonic, λ/12 in a tertiary harmonic, and λ/4n in an n-th ordered harmonic. Therefore, these harmonic processing circuits 502A are in the shorted state for a point A in the drawing in each harmonic, and the line of the λ/4 is tip shorted. Consequently, the harmonic processing circuit 502A is in the shorted state in the even harmonic while being in the open state in the odd harmonic and a class F operation is achieved. Furthermore, by the harmonic processing circuit 502A and the distributed parameter element 502B being set to have a total line lengths of λ/2, admittance in each of the harmonic processing circuit 502A for the fundamental becomes 0, whereby power loss in the fundamental becomes 0. Furthermore, PTL 3 discloses an example of the harmonic processing circuit including the lumped parameter element instead of the distributed parameter element, with the same mechanism as shown in FIG. 5. This enables not only to perform processing of a higher order harmonic, but also to miniaturize the harmonic processing circuit by using the lumped parameter element.

CITATION LIST

Patent Literature

[PTL 1]
Japanese Patent No. 2738701
[PTL 2]
Japanese Unexamined Patent Application Publication No. 2001-111362
[PTL 3]
Japanese Patent No. 4335633

SUMMARY OF INVENTION

Technical Problem

However, according to examination by the inventors, it is clarified that, in the preceding examples, when transistors each having narrow gate width and connected in parallel are used as a transistor having wide gate width, particularly for the purpose of achieving a higher output, performance of the harmonic processing circuit is not sufficient and an open function and a short function for the harmonic decrease. That is, when focusing on, for example, the secondary harmonic only, any of the preceding examples include only one harmonic processing circuit. Having only one harmonic processing circuit causes (i) a different electrical length from each of the narrow gate width transistors to the harmonic processing circuit and (ii) a different phase of the harmonic processing circuit for each of the transistors, thereby not causing the radio frequency amplifier circuit to function evenly for the transistors, according to findings by the inventors.

The present invention is conceived in view of the above problem, and has an object to provide the radio frequency amplifier circuit with high output and high efficiency.

Solution to Problem

In order to solve the above conventional problem, a radio frequency amplifier circuit according to an aspect of the present invention includes: transistors which are connected in parallel and output an amplified radio frequency signal; first harmonic processing circuits which are connected to an output terminal of the transistors and connected to each other in parallel, and each of which processes one of an even harmonic and an odd harmonic included in the radio frequency signal; and second harmonic processing circuits which are connected to the output terminal of the transistors and connected to each other in parallel, and each of which processes the other of the even harmonic and the odd harmonic included in the radio frequency signal. A connecting point between the output terminal and the first harmonic processing circuit is at a different position in an arrangement direction of the transistors depending on each of the first harmonic processing circuits, and a connecting point between the output terminal and the second harmonic processing circuit is at a different position in the arrangement direction depending on each of the second harmonic processing circuits.

This aspect causes the radio frequency amplifier circuit including transistors to have the same electrical lengths from each of the transistors to a harmonic processing circuit, thereby achieving the radio frequency amplifier circuit with high output and high efficiency.

Here, each of the first harmonic processing circuits includes: a first inductor which has one end connected to the output terminal; and a capacitor which has (i) one end connected to the other end of the first inductor and (ii) the other end connected to the ground, and may be a series resonance circuit which resonates at a frequency twice as high as an operation frequency of the transistors.

This aspect achieves a sufficient shorted state in a secondary harmonic in the harmonic processing circuit, thereby achieving the radio frequency amplifier circuit with high efficiency.

Furthermore, each of the second harmonic processing circuits may include: a second inductor which has one end connected to the output terminal; and a first distributed parameter element connected to the other end of the second inductor. The first distributed parameter element may be an open stab, and when a wavelength of the operation frequency of the transistors is set to $\lambda$, a line length of the first distributed parameter element may be $\lambda/12$.

This aspect achieves a sufficient open state in a tertiary harmonic in the radio frequency processing circuit, thereby achieving the radio frequency amplifier circuit with high efficiency.

Furthermore, the radio frequency amplifier circuit may include a matching circuit for a fundamental included in the radio frequency signal, the matching circuit being connected to the second harmonic processing circuits.

This aspect achieves the radio frequency amplifier circuit including the matching circuit.

Furthermore, the connecting point between the output terminal and the first harmonic processing circuit may be arranged in alternation with the connecting point between the output terminal and the second harmonic processing circuit.

This aspect enables to arrange the second harmonic processing circuits in clearance gaps of the first harmonic processing circuits in the arrangement direction, thereby achieving to (i) enhance a degree of freedom in layout of and (ii) further miniaturize the radio frequency amplifier circuit.

Furthermore, the first harmonic processing circuits and the second harmonic processing circuits may be disposed symmetrically with reference to a center of the output terminal in the arrangement direction.

This aspect prevents thermal destruction, by evenly dispersing output from the transistor.

Furthermore, the first harmonic processing circuits may include the first harmonic processing circuits having resonant frequencies different from each other. Furthermore, the second harmonic processing circuits may include the second harmonic processing circuits having resonant frequencies different from each other.

This aspect causes the radio frequency processing circuit to have a band in a processing of the harmonic.

Furthermore, the first harmonic processing circuit may be a processing circuit which shows a shorted state in a secondary harmonic, and the second harmonic processing circuit may be a processing circuit which shows an open state in a tertiary harmonic.

This aspect achieves the radio frequency amplifier circuit including a class F circuit with high efficiency.

Furthermore, the first harmonic processing circuit may be a processing circuit which shows the shorted state in the tertiary harmonic, and the second harmonic processing circuit may be a processing circuit which shows the open state in the secondary harmonic.

This aspect achieves the radio frequency amplifier circuit as including an inverse class F circuit with high efficiency.

Advantageous Effects of Invention

The present invention enables, in a radio frequency amplifier circuit including a high output transistor having narrow gate width transistors connected in parallel, to decrease phase difference in the harmonic processing circuit for each of the narrow gate width transistors, thereby maintaining the open state and the shorted state in the harmonic processing circuit in good states. Therefore, the radio frequency amplifier circuit with high output which enables to further improve the efficiency of the harmonic processing circuit than the conventional class F circuit and the inverse class F circuit can be achieved.

DESCRIPTION OF EMBODIMENTS

A radio frequency amplifier circuit according to embodiments of the present invention is described with reference to drawings below.

Embodiment 1

Figure 1:
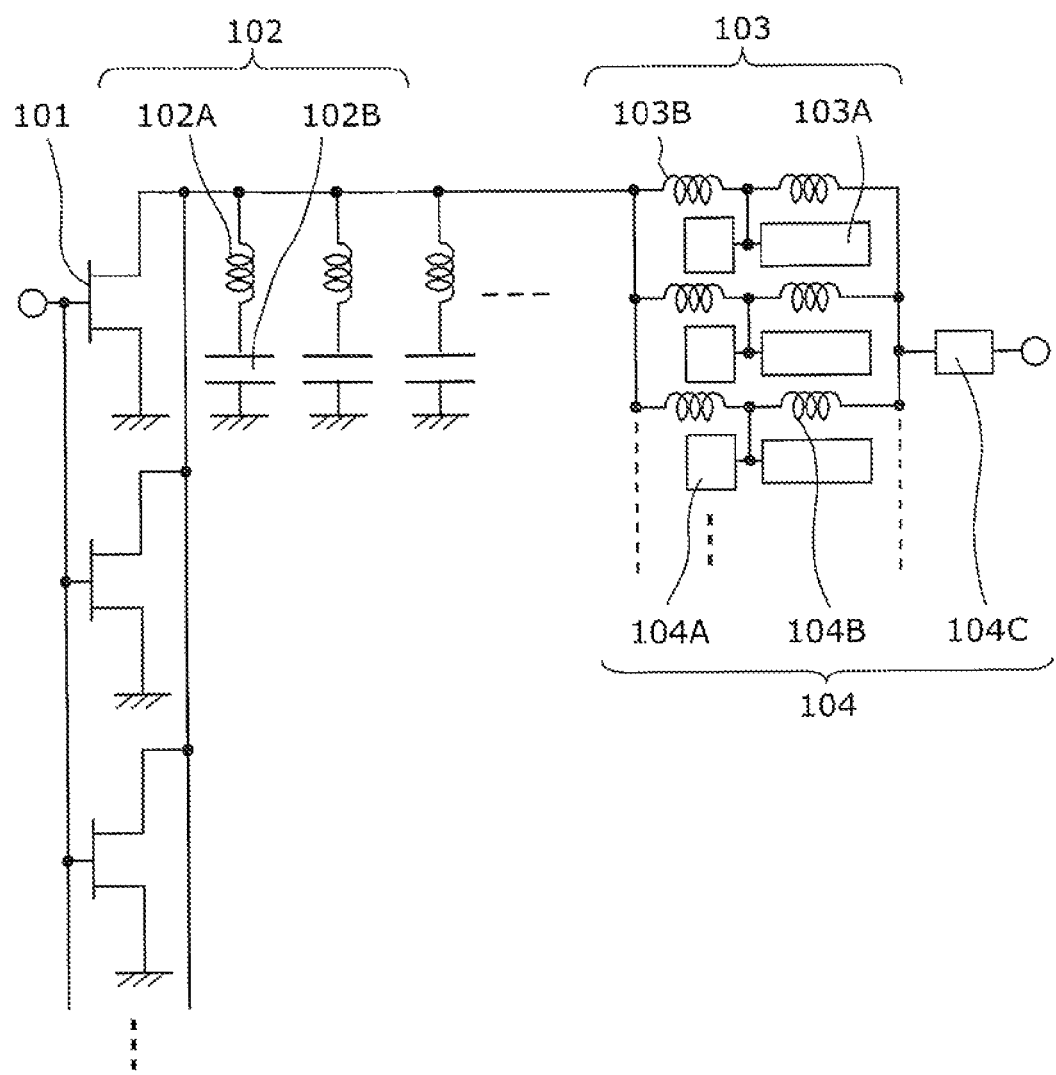
FIG. 1 is a circuit diagram of a radio frequency amplifier circuit according to an embodiment 1 of the present invention.

FIG. 1 is a circuit diagram of a radio frequency amplifier circuit according to this embodiment.

As shown in FIG. 1, this radio frequency amplifier circuit includes transistors 101 which are connected in parallel, first harmonic processing circuits 102 and second harmonic processing circuits 103 which are connected to an output terminal of the transistors 101, and a fundamental matching circuit 104.

Each of the transistors 101 has narrow gate width Wg, outputs an amplified radio frequency signal, and shares the output terminal (drain terminal) by being integrated through a wiring pattern.

The first harmonic processing circuits 102 are connected to each other in parallel, and each of the first harmonic processing circuits 102 processes the secondary harmonic included in the radio frequency signal. Each of the first harmonic processing circuits 102 is a processing circuit which shows a shorted state in the secondary harmonic.

Each of the first harmonic processing circuits 102 includes a first inductor 102A which is a lumped parameter element and a capacitor 102B which is a lumped parameter element. That is, each of the first harmonic processing circuits 102 includes: a first inductor 102A which has one end connected to the output terminal of the transistor 101; and a capacitor 102B which has (i) one end connected to the other end of the first inductor 102A and (ii) the other end connected to the ground, and is a series resonance circuit which resonates at a frequency twice as high as the operation frequency of the transistor 101.

The second harmonic processing circuits 103 are connected to each other in parallel, and each of the harmonic processing circuits 103 processes a tertiary harmonic included in the radio frequency signal. Each of the second harmonic processing circuits 103 is a processing circuit which shows an open state in the tertiary harmonic.

Each of the second harmonic processing circuits 103 includes a first distributed parameter element 103A and a second inductor 103B which is a lumped parameter element. That is, each of the second harmonic processing circuits 103 includes: a second inductor 103B which has one end connected to the output terminal of the transistor 101; and a first distributed parameter element 103A connected to the other end of the second inductor 103B.

The fundamental matching circuit 104 is connected to a downstream of the first harmonic processing circuits 102 and the second harmonic processing circuits 103, and is a matching circuit for a fundamental included in the radio frequency signal.

The fundamental matching circuit 104 includes a second distributed parameter element 104A, a third inductor 104B which is a lumped parameter element, and a circuit 104C including the lumped parameter element or a distributed parameter element, or the lumped parameter element and a distributed parameter element. That is, the fundamental matching circuit 104 includes: a third inductor 104B which has one end connected to a connecting point between the second inductor 103B and the first distributed parameter element 103A; a second distributed parameter element 104A connected between the second inductor 103B and the third inductor 104B; and a circuit connected to the other end of the third inductor 104B.

For simplifying the description, a case is assumed that one first harmonic processing circuit 102 is included. In the secondary harmonic, by (i) connecting the first harmonic processing circuit 102 for processing the secondary harmonic to the output terminal of the transistor 101 and (ii) setting each element value of the first harmonic processing circuit 102 such that the first harmonic processing circuit 102 resonates at the secondary harmonic, the impedance becomes 0 and the shorted state is achieved. For example, when the operation frequency is set to 2.4 GHz, the frequency of the secondary harmonic is 4.8 GHz, and it is sufficient to set inductance of the first inductor 102A to 3 nH and capacitance of the capacitor 102B to 0.37 pF. It is to be noted that since a resonant frequency is determined based on a product of the inductance and the capacitance, the element value can be set freely as long as this relation is maintained. Here, the first harmonic processing circuit 102 which is the series resonance circuit is directly connected to the output terminal of the transistor 101, and when there is a circuit element between the first harmonic processing circuit 102 and the output terminal, the efficiency of the first harmonic processing circuit 102 which processes the secondary harmonic is reduced depending on an effect of a loss in the circuit element. Furthermore, when there is a room in device size, the first harmonic processing circuit 102 may be further connected to an input terminal side of the transistor 101 to further improve the efficiency.

Next, the tertiary harmonic is described. In the same manner as in the secondary harmonic, a case is assumed that one second harmonic processing circuit 103 is included. The second harmonic processing circuit 103 for processing the tertiary harmonic is connected to the output terminal of the transistor 101. The first distributed parameter element 103A included in the second harmonic processing circuit 103 is an open stab, and when the wavelength of the tertiary harmonic is set to $\lambda 3$, the second harmonic processing circuit 103 shows the shorted state when the line length is $\lambda 3/4$, that is $\lambda/12$. Therefore, when focusing on the tertiary harmonic, a parallel circuit of a parasitic capacitance (not shown) of the transistor 101, the first harmonic processing circuit 102 which processes the secondary harmonic, and the second inductor 103B is formed. Here, the first harmonic processing circuit 102 has 0 impedance in the secondary harmonic. However, the first harmonic processing circuit 102 operates as an inductive circuit in a frequency higher than the secondary harmonic, thereby finally arrives down to the parallel resonance circuit of the parasitic capacitance of the transistor 101 and the inductor. Here, by setting the impedance of the parallel resonance circuit to infinity, the tertiary harmonic shows the open state when observed from the output terminal of the transistor 101.

Consequently, the class F circuit is achieved by the first harmonic processing circuit 102 and the second harmonic processing circuit 103. Practically, it is possible to further improve the efficiency by connecting the class F circuit to the third inductor 104B and the second distributed parameter element 104A, namely, the fundamental matching circuit 104, so as to connect the transistor 101 to an external circuit via this class F circuit. However, depending on the transistor 101, there is a case where it is difficult to perform matching by the fundamental matching circuit 104 only, and a circuit 104C is used with the fundamental matching circuit 104. Furthermore, the second distributed parameter element 104A does not have a direct relationship with the class F circuit and may be omitted.

It is to be noted that it is also possible to include the distributed parameter element in the first harmonic processing circuit 102 which processes the secondary harmonic. However, the configuration shown in FIG. 1 is used because using the distributed parameter element causes (i) a disadvantage in miniaturizing the first harmonic processing circuit 102, and (ii) a deterioration in an open function and a short function of the class F circuit resulting from an unnecessary coupling of lines due to proximity of the first harmonic processing circuit 102 and the first distributed parameter element 103A of the second harmonic processing circuit 103 which processes the tertiary harmonic, as shown in a layout example described later. In the same manner, it is also possible to include the lumped parameter element in the second harmonic processing circuit 103 which processes the tertiary harmonic. However, the configuration shown in FIG. 1 is used because it is difficult to inexpensively manufacture a capacitor which has an operation frequency of a GHz band, a self-resonant frequency high enough to be used with the tertiary harmonic, and tolerance to the high output operation.

Furthermore, effect of waveform forming to the efficiency of the amplifier circuit is diminished in a higher order harmonic. Meanwhile, adding a higher-order harmonic processing circuit affects the secondary harmonic processing circuit and the tertiary harmonic processing circuit, which complexes the circuit structure of the harmonic processing circuit and results in causing it to be difficult to miniaturize and inexpensively manufacture the amplifier circuit. Accordingly, the radio frequency amplifier circuit in FIG. 1 is structured with taking processing of the secondary harmonic and the tertiary harmonic into consideration.

Furthermore, the class F circuit to be in the shorted state in the secondary harmonic and the open state in the tertiary harmonic is formed by the first harmonic processing circuit 102 and the second harmonic processing circuits 103. However, the inverse class F circuit to be in the open state in the secondary harmonic and the shorted state in the tertiary harmonic may be formed, each of the first harmonic processing circuits 102 being a processing circuit which shows the shorted state in the tertiary harmonic and each of the second harmonic processing circuits 103 being a processing circuit which shows the open state in the secondary harmonic in the inverse class F circuit. In this case, it is sufficient to perform the tertiary harmonic processing by the first inductor 102A including the lumped parameter element and the capacitor 102B, and perform the secondary harmonic processing by the first distributed parameter element 103A and the second inductor 103B which includes the lumped parameter element. In the same manner as in the class F circuit, the impedance becomes 0 in the tertiary harmonic by the series resonance in the first harmonic processing circuit 102, and the shorted state in the tertiary harmonic is achieved. In the secondary harmonic, the shorted state is achieved by setting the line length of the first distributed parameter element 103A to λ/8. Therefore, when focusing on the secondary harmonic, the first harmonic processing circuit 102 arrives down to the parallel resonance circuit of the parasitic capacitance (not shown) of the transistor 101 and the inductor, and it is sufficient to set the second inductor 103B such that the impedance of the parallel resonance circuit becomes infinity.

Furthermore, the transistor 101 is not limited to include constituent materials such as silicon (Si), gallium arsenide (GaAs), and gallium nitride (GaN), nor limited to specific kinds of transistors such as a bipolar transistor and a field effect transistor. Furthermore, the transistor 101 may include individual discrete components mounted.

Next, a case is assumed that plural secondary harmonic processing circuits and plural tertiary harmonic processing circuits are included. Taking the first harmonic processing circuit 102 as an example, including harmonic processing circuits duplicates the short function, enhances short performance for the harmonic, and improves the efficiency. For example, in the secondary harmonic processing circuit, though an ideal shorted state has 0+j0 impedance, practically, impedance of a real part is not 0 because of a loss by the inductor or the capacitor. However, this real part can be reduced by including plural inductors and capacitors.

In this case, the shorted state is achieved by determining the element value with slightly changing the resonant frequencies of the first harmonic processing circuits 102, namely, by causing the first harmonic processing circuits 102 to include first harmonic processing circuits 102 having resonant frequencies different from each other, to cause the processing of the secondary harmonic to have a band. In the same manner, the open state is achieved by causing the second harmonic processing circuits 103 to include resonant frequencies different from each other to cause the processing of the tertiary harmonic to have a band.

For example, the shorted state is achieved in a band ranging from the 4.8 GHz to a 5.0 GHz, by setting the frequency of the fundamental to the 2.4 GHz and independently determining the element value of each of the first harmonic processing circuits 102 such that a first one resonates at the 4.8 GHz, a second one resonates at a 4.9 GHz, and a third one resonates at the 5.0 GHz. Furthermore, by providing, to each of the first harmonic processing circuits 102 which has the resonant frequency, with plural circuits which resonate with the same frequency as the corresponding one of the first harmonic processing circuits 102, the shorted state with a bandwidth is achieved while maintaining a sufficient shorted state in each frequency.

It has been described that the first harmonic processing circuit 102 processes the secondary harmonic which is the even harmonic, and the second harmonic processing circuit 103 processes the tertiary harmonic which is the odd harmonic. However, as long as the first harmonic processing circuit 102 processes one of the even harmonic and the odd harmonic included in the amplified radio frequency signal, and the second harmonic processing circuit 103 processes the other of the even harmonic and the odd harmonic included in the amplified radio frequency signal, the order is not specifically limited to secondary and tertiary. Accordingly, the first harmonic processing circuits 102 may include first harmonic processing circuits 102 which process different even harmonics. For example, it is possible to cause the first harmonic processing circuits 102 to process harmonics of a high order by setting a first one as a second harmonic processing circuit which resonates at the 4.8 GHz, a second one as a fourth-order harmonic processing circuit which resonates at a 9.6 GHz, and a third one as a sixth-order harmonic processing circuit which resonates at a 14.4 GHz. In this case, by providing plural circuits which resonate with the same frequency as the corresponding one of the secondary harmonic processing circuits, for example, a sufficient shorted state in each frequency is achieved while processing a higher-order harmonic, thereby achieving the amplifier circuit with high efficiency.

Figure 2:
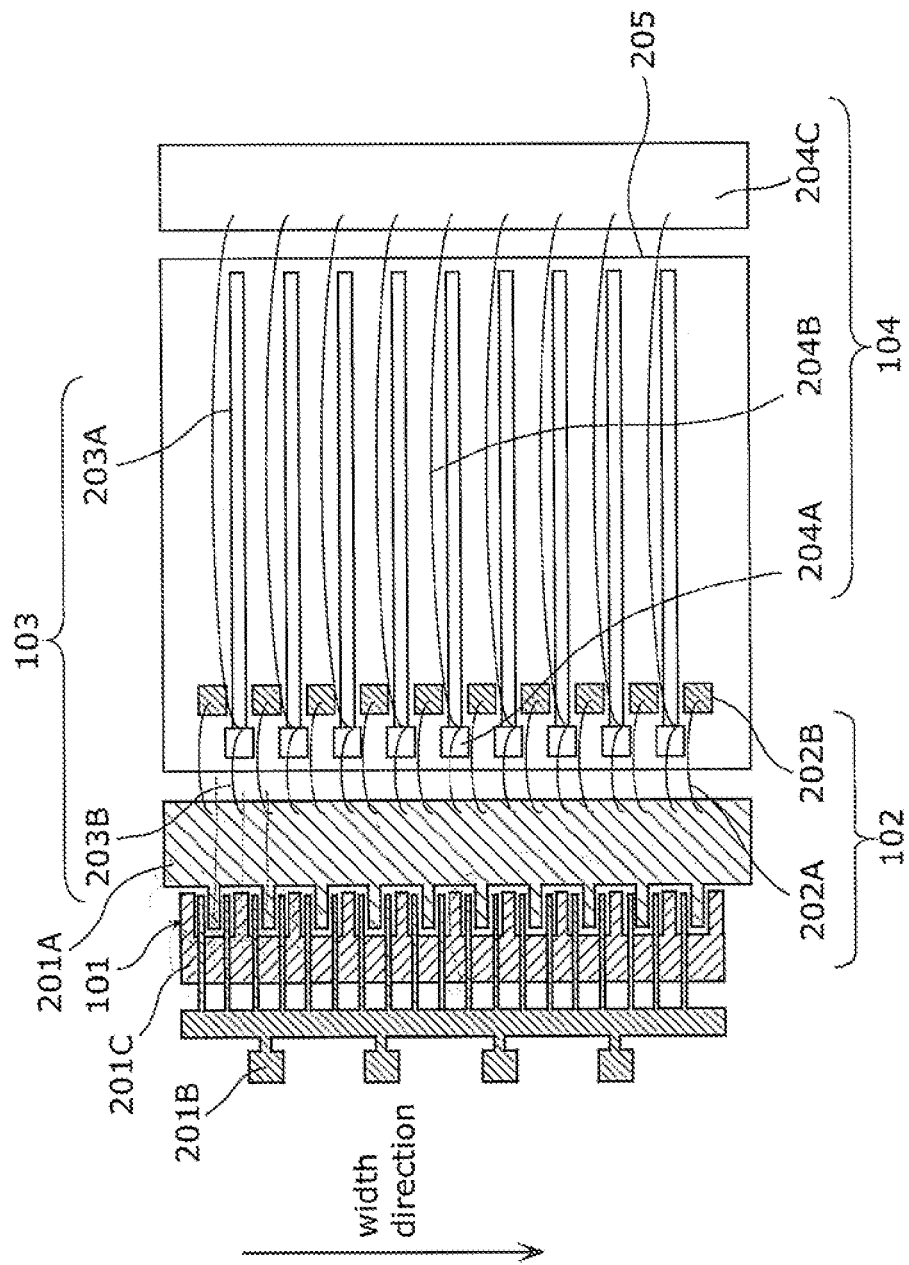
FIG. 2 is a layout chart of the radio frequency amplifier circuit according to the embodiment 1 of the present invention.

FIG. 2 is a layout chart of the radio frequency amplifier circuit according to this embodiment.

The transistors 101 are assumed to have high output to the extent of 100 W (class), and a total gate width (Wg) is 36 mm. The transistors 101 consist of minute gate width Wg and connected in parallel, and a chip size of the transistors 101 is, for example, horizontal dimension of 0.7 mm and a vertical dimension of 4.5 mm. This transistor 101 includes: an output terminal 201A; a gate terminal (input terminal) 201B; and a source terminal 201C, the output terminal 201A being connected with the first harmonic processing circuit 102 and the second harmonic processing circuit 103. In the layout in FIG. 2, a source terminal 201C and finger-shaped source electrodes arranged in a width direction are connected, and an output terminal 201A and finger-shaped drain electrodes arranged in the width direction are connected. Gate electrodes connected with the gate terminal 201B are provided between the source electrodes and the drain electrodes. Each of the gate electrodes forms a different transistor.

The first harmonic processing circuit 102 includes a wire 202A as the first inductor 102A and a capacitor 202B as the capacitor 102B. The first harmonic processing circuits 102 are disposed along the arrangement direction (width direction in FIG. 2) of the transistors 101.

Depending on each of the first harmonic processing circuits 102, a connecting point between the output terminal 201A and the first harmonic processing circuit 102 is at a different position in the arrangement direction of the transistor 101. Specifically, connecting points of wires 202A in the output terminal 201A are at different positions in the arrangement direction of the transistor 101.

The second harmonic processing circuit 103 includes a first distributed parameter element 203A as the first distributed parameter element 103A and a wire 203B as the second inductor 103B. The second harmonic processing circuits 103 are disposed along the arrangement direction (width direction in FIG. 2) of the transistors 101.

The fundamental matching circuit 104 includes a second distributed parameter element 204A as the second distributed parameter element 104A, a wire 204B as the third inductor 104B, and a circuit 204C as the circuit 104C.

Depending on each of the second harmonic processing circuits 103, a connecting point between the output terminal 201A and the second harmonic processing circuit 103 is at a different position in the arrangement direction of the transistor 101. Specifically, connecting points of wires 203B in the output terminal 201A are at different positions in the arrangement direction of the transistor 101.

Capacitors 202B are formed separately on the dielectric substrate 205 in a form of islands. The capacitor 202B, the first distributed parameter element 203A, and the second distributed parameter element 204A are disposed on a same dielectric substrate 205.

The radio frequency amplifier circuit according to this embodiment is provided with (i) the first harmonic processing circuits 102 (ii) and the second harmonic processing circuits 103 disposed between the first harmonic processing circuits 102, and thus the first harmonic processing circuit 102 is disposed in alternation with the second harmonic processing circuit 103. The number of the first harmonic processing circuits 102 is greater than the number of the second harmonic processing circuits 103 by 1. The connecting point between the output terminal 201A and the first harmonic processing circuit 102 is arranged in alternation with the connecting point between the output terminal 201A and the second harmonic processing circuit 103 in the arrangement direction of the transistors 101.

Here, when the frequency of the fundamental is set to the 2.4 GHz and the inductance of the wire 202A included in the first harmonic processing circuit 102 is set to 3 nH, the capacitance of the capacitor 202B for causing the first harmonic processing circuit 102 to resonate with the secondary harmonic (4.8 GHz) is 0.37 pF. The capacitor 202B for achieving this capacitance has, when an oxidized film ($SiO_2$) having approximately 4 of dielectric constant is used for the capacitor, 3.1 e4 $\mu m^2$ of an area of a counter electrode when a thickness of the $SiO_2$ is set to 3 $\mu m$, and a side of 176.2 $\mu m$ when it is converted to a square pattern. When 10 capacitors 202B are disposed, the total length of the 10 capacitors including intervals of 300 $\mu m$ between the capacitors 202B is 4.5 mm, which is almost a dimension of the width direction of the transistor 101, and thus the second harmonic processing circuits 103 can be disposed at the intervals between the capacitors 202B. However, the form of the capacitor 202B is not limited to the above. When causing the pattern of the capacitor 202B to operate as the lumped parameter element, and when the wavelength of the secondary harmonic is set to $\lambda 2$ (=62.5 mm), preferably, a size of the pattern is equal to or less than $\lambda 2/4$, and more preferably, equal to or less than $\lambda 2/8$. It is because an experience shows that the wavelength of equal to or less than ¼ is a scope which the pattern size can be ignored against the wavelength of the frequency to be handled, and it is sufficient if the pattern size is formed sufficiently small with respect to the wavelength of the secondary harmonic.

The output terminal 201A of the transistor 101 is connected with the second harmonic processing circuit 103. The wire 203B is connected between the first distributed parameter element 203A and the second distributed parameter element 204A. The wire 204B is connected from a portion between the first distributed parameter element 203A and the second distributed parameter element 204A to the circuit 204C which is a part of the fundamental matching circuit 104.

The first distributed parameter element 203A is an open stab which has the line length of $\lambda/12$ when the wavelength of the operation frequency of the transistor 101 is set to $\lambda$, and shows the shorted state in the tertiary harmonic. For example, when the first distributed parameter element 203A is a line which is pattern-formed on $SiO_2$ in the same manner as Metal-Insulator-Semiconductor (MIS) capacitance, the line length of the first distributed parameter element 203A is 5.2 mm, taking a wavelength shortening in the dielectric substrate 205 having dielectric constant of 4 into consideration.

Although the capacitor 202B, the first distributed parameter element 203A, and the second distributed parameter element 204A are pattern-formed on the same dielectric substrate 205 in FIG. 2, the same effect is obtained when they are formed dividedly on different dielectric substrates.

The second distributed parameter element 204A is used not only as a part of the fundamental matching circuit 104 but also as a guide forming the first distributed parameter element 203A, thereby enabling an accurate manufacturing of the line length of the first distributed parameter element 203A. Therefore, in FIG. 2, the first distributed parameter element 203A and the second distributed parameter element 204A have different line widths.

Although one wire 202A is formed for one capacitor 202B in FIG. 2, plural wires 202A may be formed for one capacitor 202B. Forming plural wires enables to adjust the inductance of the first inductor 102A. In the same manner, plural wires 203B and 204B may be formed.

Furthermore, in FIG. 2, the first harmonic processing circuit 102 and the second harmonic processing circuit 103 are connected so as to be within 4.5 mm which is the dimension of the width direction of the transistor. However, as long as it is possible to achieve the high efficiency operation, the harmonic processing circuit may be disposed in a wider width than the dimension of the width direction of the transistor 101. However, in this structure, the wire 202A and the wire 2036, of the harmonic processing circuit disposed in an outer side in the width direction, are to be wired at an angle (at an angle relative to the direction vertical to the width direction). This causes the inductance of the harmonic processing circuit in the outer side in the width direction to be different from the inductance of other harmonic processing circuits in an inner side. Therefore, the capacitor 202B of the harmonic processing circuit in the outer side is required to have an optimal structure.

Furthermore, although the radio frequency amplifier circuit can accommodate 10 first harmonic processing circuits 102 and 9 second in harmonic processing circuits 103 in FIG. 2, the number is not limited to the above. Using a dielectric substrate 205 with high dielectric constant enables to miniaturize the area of the capacitor 202B, thereby enabling to dispose further more first harmonic processing circuits 102 and second harmonic processing circuits 103.

As described above, the radio frequency amplifier circuit according to this embodiment is a circuit which includes plural secondary harmonic processing circuits and tertiary harmonic processing circuits, and, depending on each of the first harmonic processing circuits 102, a connecting point between the output terminal 201A and the wire 202A are at a different position in the arrangement direction of the transistors 101. Therefore, the phase difference in the secondary harmonic processing circuit for the transistor 101 is reduced and the shorted state of the secondary harmonic processing circuit is maintained in a good state.

In the same manner, depending on each of the second harmonic processing circuits 103, a connecting point between the output terminal 201A and the wire 203B is at a different position in the arrangement direction of the transistors 101. Accordingly, the phase difference in the tertiary harmonic processing circuit for the transistor 101 is reduced and the open state of the tertiary harmonic processing circuit is maintained in a good state. Therefore, a higher efficiency than the conventional class F circuit is achieved.

Figure 4A:
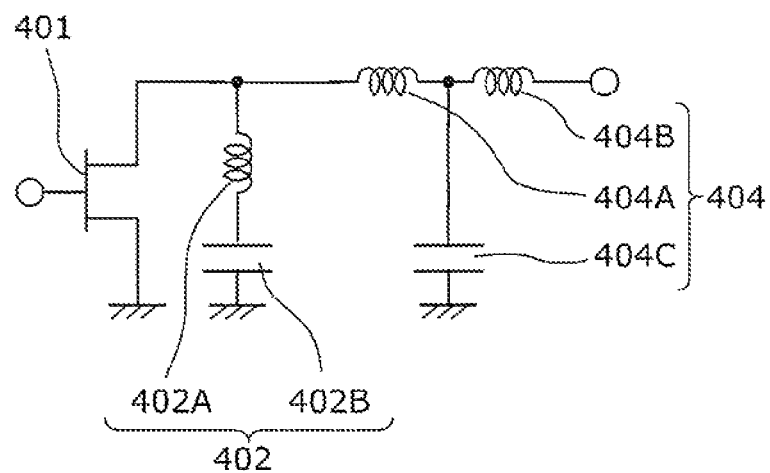
FIG. 4A is a circuit diagram of a conventional radio frequency amplifier circuit.
Figure 4B:
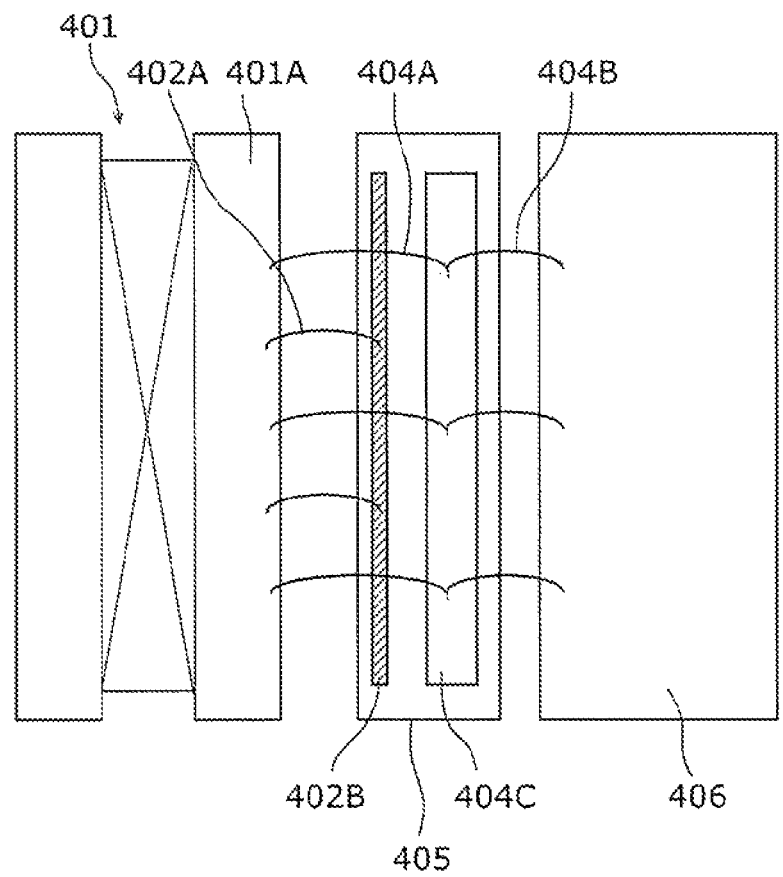
FIG. 4B is a layout chart of the conventional radio frequency amplifier circuit.
Figure 5:
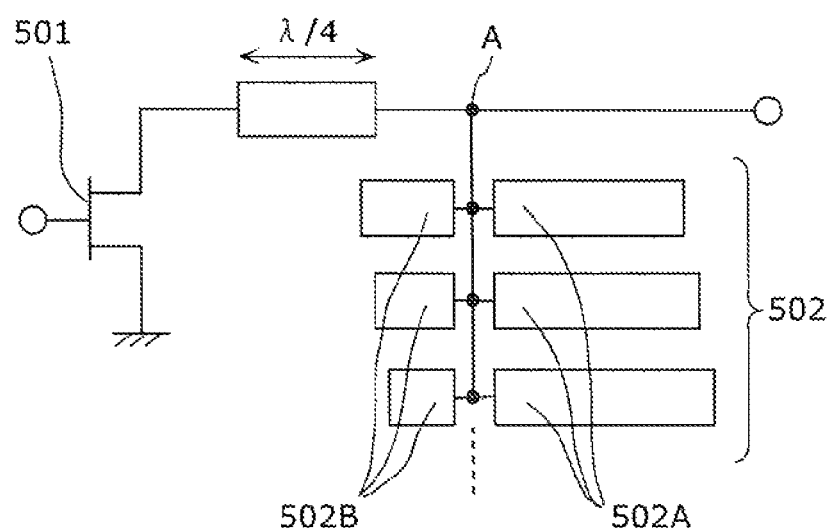
FIG. 5 is a circuit diagram of a conventional radio frequency amplifier circuit.

Furthermore, as shown in the radio frequency amplifier circuit according to this embodiment, providing plural secondary harmonic processing circuits and disposing the tertiary harmonic processing circuits between the secondary harmonic processing circuits enables to further miniaturize and improve the degree of freedom in design of the radio frequency amplifier circuit. It is because, when one large capacitor is provided as in the configuration in FIG. 4B, (i) a first distributed parameter line has to be formed in further outer side of the capacitor (outer side in a direction away from the transistor) which makes it more difficult to miniaturize and (ii) the wire has to be formed across the capacitor which limits a wire length.

In this embodiment, it has been described that the number of the first harmonic processing circuits 102 is greater than the number of the second harmonic processing circuits 103 by 1. However, as long as the first harmonic processing circuit 102 is arranged in alternation with the second harmonic processing circuit 103 in the arrangement direction of the transistors 101, the number of the second harmonic processing circuits 103 may be greater than the number of the first harmonic processing circuits 102 by 1. However, it is preferable to dispose the first harmonic processing circuits 102 and the second harmonic processing circuits 103 symmetrically with reference to a center of the transistors 101 in the width direction. In other words, it is preferable to dispose the first harmonic processing circuits 102 and the second harmonic processing circuits 103 symmetrically with reference to a center of the output terminal 201A in the arrangement direction of the transistors. Thus, especially when handling high electric power, it is possible to prevent thermal destruction, by evenly distributing output from the transistor.

Embodiment 2

Figure 3:
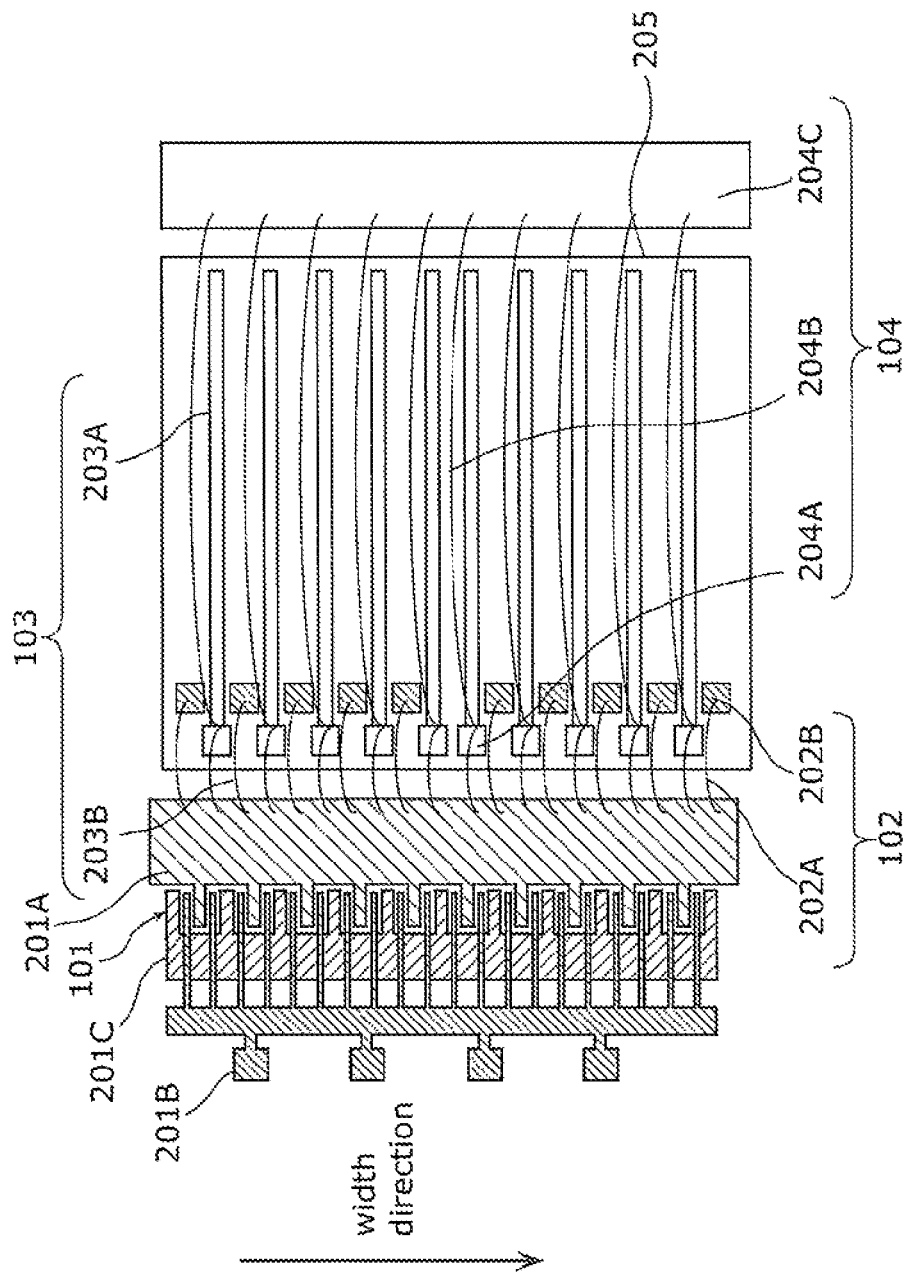
FIG. 3 is a layout chart of the radio frequency amplifier circuit according to an embodiment 2 of the present invention.

FIG. 3 is a layout chart of the radio frequency amplifier circuit according to this embodiment.

This radio frequency amplifier circuit is, as shown in FIG. 3, different from the radio frequency amplifier circuit in the embodiment 1 in a point that the same number of the first harmonic processing circuit 102, the second harmonic processing circuit 103, and the fundamental matching circuit 104 are provided.

Furthermore, the radio frequency amplifier circuit shown in FIG. 3 is different from the radio frequency amplifier circuit in the embodiment 1 in a point that the first harmonic processing circuit 102 is not disposed in alternation with the second harmonic processing circuit 103. However, by disposing each of the first harmonic processing circuit 102 and the second harmonic processing circuit 103 symmetrically with respect to the center of the transistors 101, the same effect as the embodiment 1 is obtained. Consequently, it is possible not only to improve the efficiency but also to prevent the thermal destruction during a high output operation.

Although 10 first harmonic processing circuits 102, 10 second harmonic processing circuits 103 and 10 fundamental matching circuits 104 are disposed in FIG. 3, the number is not limited to the above.

As described above, the radio frequency amplifier circuit according to this embodiment achieves to improvement in the efficiency of and downsizing of the harmonic processing circuit, based on the same reason as in the embodiment 1.

The radio frequency amplifier circuit according to the present invention has been described based on the embodiments, however, the present invention is not limited to these embodiments. Various modifications conceived by a person skilled in the art within a scope that does not deviate from a gist of the present invention are included within the scope of the present invention. Furthermore, constituent elements in the embodiments may be arbitrary combined within a scope that does not deviate from a drift of the present invention.

Each of the (i) transistor 101, (ii) the first harmonic processing circuit 102 and the second harmonic processing circuit 103, and (iii) the fundamental matching circuit 104 is formed on a different chip (different dielectric substrates). However, for example, the wire 202A which forms the first harmonic processing circuit 102, the wire 203B which forms the second harmonic processing circuit 103, the capacitor 202B, and the first distributed parameter element 203A may be formed on a same chip, the wire 202A and the wire 203B being formed by a line pattern. In this case, only the third inductor 104B may be the wire 204B because it is required to connect the wire 204B across the first distributed parameter element 203A.

INDUSTRIAL APPLICABILITY

The present invention may be used for a radio frequency amplifier circuit, and specifically for a terminal and a base station for mobile communication and a high output power amplifier applicable for microwave home appliances such as a microwave.

REFERENCE SIGNS LIST 101, 401, 501 Transistor
102 First harmonic processing circuit
102A, 402A First inductor
102B, 202B, 402B Capacitor
103 Second harmonic processing circuit
103A, 203A First distributed parameter element
103B Second inductor
104, 404 Fundamental matching circuit
104A, 204A Second distributed parameter element
104B Third inductor
104C, 204C Circuit
201A, 401A Output terminal
201B Gate terminal
201C Source terminal
202A, 203B, 204B Wire
205, 405 Dielectric substrate
402 Secondary harmonic processing circuit
404A, 404B Fundamental matching inductor
404C Fundamental matching capacitor
406 External circuit
502 Distributed parameter element group
502A Harmonic processing circuit
502B Distributed parameter element

The invention claimed is:

1. A radio frequency amplifier circuit comprising:
a plurality of transistors which are connected in parallel and output an amplified radio frequency signal;
a plurality of first harmonic processing circuits which are connected to an output terminal of said transistors and connected to each other in parallel, and each of which processes one of an even harmonic and an odd harmonic included in the radio frequency signal; and
a plurality of second harmonic processing circuits which are connected to said output terminal of said transistors and connected to each other in parallel, and each of which processes the other of the even harmonic and the odd harmonic included in the radio frequency signal;
wherein, depending on each of said first harmonic processing circuits, a connecting point between said output terminal and said first harmonic processing circuit is at a different position in an arrangement direction of said transistors, and
depending on each of said second harmonic processing circuits, a connecting point between said output terminal and said second harmonic processing circuit is at a different position in the arrangement direction.

2. The radio frequency amplifier circuit according to claim 1,
wherein said first harmonic processing circuits are disposed in the arrangement direction, and
said second harmonic processing circuits are disposed in the arrangement direction.

3. The radio frequency amplifier circuit according to claim 1,
wherein said transistors share said output terminal,
each of said first harmonic processing circuits and said second harmonic processing circuits includes a wire as an inductor, and
connecting points of a plurality of wires including said wire in said output terminal are at different positions in the arrangement direction.

4. The radio frequency amplifier circuit according to claim 1,
wherein each of said first harmonic processing circuits includes: a first inductor which has one end connected to said output terminal; and a capacitor which has (i) one end connected to the other end of said first inductor and (ii) the other end connected to the ground, and is a series resonance circuit which resonates at a frequency twice as high as an operation frequency of said transistors.

5. The radio frequency amplifier circuit according to claim 4,
wherein a plurality of capacitors including said capacitor are formed separately in a form of islands.

6. The radio frequency amplifier circuit according to claim 1,
wherein each of said second harmonic processing circuits includes: a second inductor which has one end connected to said output terminal; and a first distributed parameter element connected to the other end of said second inductor.

7. The radio frequency amplifier circuit according to claim 6,
wherein said first distributed parameter element is an open stab, and
when a wavelength of the operation frequency of said transistors is set to $\lambda$, a line length of said first distributed parameter element is $\lambda/12$.

8. The radio frequency amplifier circuit according to claim 1, further comprising
a matching circuit for a fundamental included in the radio frequency signal, said matching circuit being connected to said second harmonic processing circuits.

9. The radio frequency amplifier circuit according to claim 6, further comprising
a matching circuit for the fundamental included in the radio frequency signal, said matching circuit being connected to said second harmonic processing circuits,
wherein said matching circuit includes: a third inductor which has one end connected to a connecting point between said second inductor and said first distributed parameter element; a second distributed parameter element connected between said second inductor and said third inductor; and a circuit connected to the other end of said third inductor.

10. The radio frequency amplifier circuit according to claim 1,
wherein the connecting point between said output terminal and said first harmonic processing circuit is arranged in alternation with the connecting point between said output terminal and said second harmonic processing circuit.

11. The radio frequency amplifier circuit according to claim 10,
wherein the number of said first harmonic processing circuits is greater than the number of said second harmonic processing circuits by 1.

12. The radio frequency amplifier circuit according to claim 10, wherein the number of said second harmonic processing circuits is greater than the number of said first harmonic processing circuits by 1.

13. The radio frequency amplifier circuit according to claim 10,
wherein said first harmonic processing circuits and said second harmonic processing circuits are disposed symmetrically with reference to a center of said output terminal in the arrangement direction.

14. The radio frequency amplifier circuit according to claim 1,
wherein each of said first harmonic processing circuits includes: a first inductor which has one end connected to said output terminal; and a capacitor which has (i) one end connected to the other end of said first inductor and (ii) the other end connected to the ground,
each of said second harmonic processing circuits includes: a second inductor which has one end connected to said output terminal; and a first distributed parameter element connected to the other end of said second inductor, and
said capacitor and said first distributed parameter element are disposed on a same substrate.

15. The radio frequency amplifier circuit according to claim 1,
wherein said first harmonic processing circuits include said first harmonic processing circuits having resonant frequencies different from each other.

16. The radio frequency amplifier circuit according to claim 1,
wherein said second harmonic processing circuits include said second harmonic processing circuits having resonant frequencies different from each other.

17. The radio frequency amplifier circuit according to claim 1,
wherein said first harmonic processing circuit is a processing circuit which shows a shorted state in a secondary harmonic, and
said second harmonic processing circuit is a processing circuit which shows an open state in a tertiary harmonic.

18. The radio frequency amplifier circuit according to claim 1,
wherein said first harmonic processing circuit is a processing circuit which shows the shorted state in the tertiary harmonic, and
said second harmonic processing circuit is a processing circuit which shows the open state in the secondary harmonic.

19. The radio frequency amplifier circuit according to claim 1,
wherein said transistors share said output terminal.

* * * * *